United States Patent [19]

Klinger et al.

[11] Patent Number: 5,280,410
[45] Date of Patent: Jan. 18, 1994

[54] ELECTRICAL SWITCHING AND CONTROL DEVICE, IN PARTICULAR FOR MOTOR VEHICLES

[75] Inventors: Herbert Klinger, Nuermberg; Gerhard Thomas, Fuerth; Martin Petrzik, Nuermberg, all of Fed. Rep. of Germany

[73] Assignee: Robert Bosch GmbH, Stuttgart, Fed. Rep. of Germany

[21] Appl. No.: 923,785
[22] PCT Filed: Mar. 23, 1991
[86] PCT No.: PCT/DE91/00261
§ 371 Date: Aug. 19, 1992
§ 102(e) Date: Aug. 19, 1992
[87] PCT Pub. No.: WO91/16807
PCT Pub. Date: Oct. 31, 1991

[30] Foreign Application Priority Data

Apr. 14, 1990 [DE] Fed. Rep. of Germany ....... 4012182

[51] Int. Cl.$^5$ .............................................. H05K 7/20
[52] U.S. Cl. .................................... 361/709; 257/719; 361/736
[58] Field of Search ............... 174/16.3; 257/706, 707, 257/712, 713, 718, 719; 165/80.3, 185; 439/485; 361/380, 382, 383, 386-389, 395, 399, 413; 123/41.31

[56] References Cited

U.S. PATENT DOCUMENTS

| 4,557,225 | 12/1985 | Sagues | 123/41.31 |
| 4,605,986 | 8/1986 | Bentz et al. | 361/386 |
| 4,716,498 | 12/1987 | Ellis | 361/386 |
| 4,899,256 | 2/1990 | Sway-Tin | 361/386 |
| 5,148,350 | 9/1992 | Chan et al. | 361/386 |

FOREIGN PATENT DOCUMENTS

| 2530157 | 2/1977 | Fed. Rep. of Germany . |
| 3310477 | 1/1984 | Fed. Rep. of Germany . |
| 3502584 | 7/1986 | Fed. Rep. of Germany . |
| 3712235 | 10/1988 | Fed. Rep. of Germany . |
| 2045009 | 10/1980 | United Kingdom . |

Primary Examiner—Gerald P. Tolin
Attorney, Agent, or Firm—Michael J. Striker

[57] ABSTRACT

An electrical switching and control device, particularly for motor vehicles has a housing a printed circuit board, a plurality of electronic power components arranged in the housing and having leads soldered with the printed circuit board, another component element carried by the printed circuit board and connected with the latter, a heat sink carrying the power components and mechanically connected with the printed circuit board and also receiving heat generated in the power components and guiding it outwards, a plug-in strip arranged at the front side of the housing and soldered at its rear end with the printed circuit board, the plug-in strip being lockable at the printed circuit board, a frame formed so that the heat sink grasps the plug-in strip by the frame and is securely connected with the printed circuit board, a front panel placed on the plug-in strip with interposition of a seal and screwed together with the frame of the heat sink, the housing and having a front housing opening which is tightly closed by the front panel with a sealing ring.

10 Claims, 2 Drawing Sheets

ELECTRICAL SWITCHING AND CONTROL DEVICE, IN PARTICULAR FOR MOTOR VEHICLES

BACKGROUND OF THE INVENTION

The present invention relates to an electrical switching and control device, in particular for motor vehicles.

An electrical switching device is known from WO 78/01007 in which power components are connected with a heat sink so as to conduct heat and so as to be electrically insulated and the leads of the power components are contacted by a printed circuit board which is in turn contacted by a plug-in strip at the front side of the switching device. The heat sink is fastened to the printed circuit board by screws and the heat which it absorbs from the power components is guided out via the front panel or via the housing in a heat conducting and electrically insulated manner. Moreover, it is known from DE-OS 33 10 477 to fasten the plug-in strip with a sealing ring at a front panel of the housing by screws to seal the housing so as to be tight against moisture and then to fasten the latter on the front housing opening of the switching and control device via another sealing ring.

A disadvantage in such solutions consists in that the solder connections of the connector tongues with the conductor paths of the printed circuit board are mechanically loaded during and after the final assembly by manufacturing and assembly tolerances. Moreover, the length of the heat sink is determined in this case by the width of the plug-in strip so that only a limited number of power components can be accommodated in the switching and control device. For additional power components, additional heat sinks or cooling plates must be arranged in the region of the housing base or the side walls and must be screwed and riveted individually with the printed circuit board, which likewise results in tolerance problems.

SUMMARY OF THE INVENTION

The present solution aims at constructing a heat sink in such a way that a multitude of electrical power components can be connected with it in a heat conducting manner on the one hand and on the other hand so as to allow a simple assembly of the printed circuit board with the plug-in strip at the front panel in which the solder connections of the plug-in parts at the printed circuit board do not remain mechanically loaded after the soldering process.

In keeping with these objects and with others which will become apparent hereinafter, one feature of the present invention resides, briefly stated, in an electrical switching and control device in which the plug-in strip can be locked at the printed circuit board, the heat sink grasps the plug-in strip by a frame and is securely connected with the printed circuit board, a front panel is placed onto a collar of the plug-in strip with the intermediary of a seal and is securely screwed together with the frame of the heat sink, and the front panel tightly closes the front housing opening with a sealing ring.

When the electrical switching and control device is designed in accordance with the present invention, it has the advantage that the solder connections of the plug in parts at the printed circuit board are relieved of mechanical loading in an inexpensive and simple manner by arranging the front panel at the heat sink so as to be tight against moisture and that even when there is a great number of electronic power components the heat generated by them can be quickly absorbed by the heat sink and guided off to the outside via the front panel. Another advantage consists in that the heat from all power components can be absorbed in a very favorable manner regardless of their placement by the possible relatively large mass of the heat sink. In a switching and control device with a plurality of power components it is particularly advisable that the heat sink have a plate-shaped portion at opposite sides of its frame enclosing the plug-in strip, which portion is bent back or parallel to the plug-in strip and at which the power components are arranged in a heat conducting manner. An advisable receptacle and fixed fastening of the plug-in strip is achieved before the latter is soldered in the frame of the heat sink in that the plug-in strip has a groove externally at its narrow sides in which a strip of the heat sink frame engages. This results in a simple plug-in assembly and further in an advantageous possibility for compensating for the manufacturing and assembly tolerances in which the groove width at the plug-in strip is selected so as to be greater than the strip thickness at the heat sink frame and in that an extruded projection is formed on at every groove to compensate for tolerances.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF A PREFERRED EMBODIMENT

Figure 1:
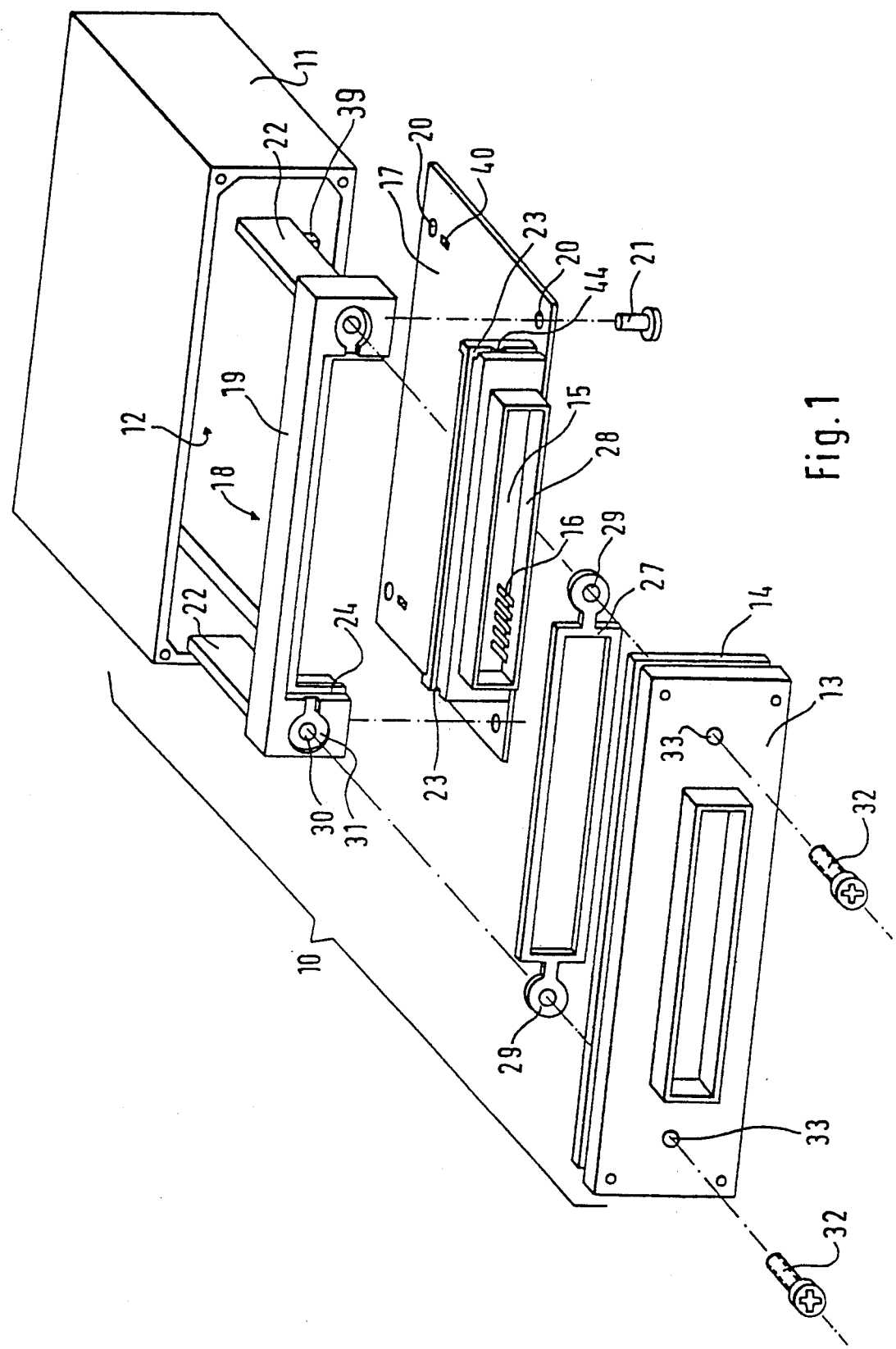
FIG. 1 shows a spatial view of the individual parts of the switching and control device prior to assembly.

FIG. 1 shows a spatial view of the individual parts of a switching and control device 10, according to the invention, for a motor vehicle. It includes a housing of insulating material or an aluminum housing 11 with an end face 12 which is open at the front and can be closed so as to be tight against moisture by a front panel 13 of aluminum by a sealing ring 15 and four screws, not shown. To manufacture the device 10, a prefabricated plug-in strip 15 with plug-in tongues embedded in plastic is first placed on the front end of a printed circuit board 17 in which the plug-in tongues 16 project through corresponding holes, not shown, in the printed circuit board 17 with their rear, bent down ends. The plug-in strip 15 can be locked with the printed circuit board 17 in the provided position by catch means which are formed on at the plug-in strip 15. A heat sink 18 of die-cast aluminum is then placed on the printed circuit board 17 and the heat sink 18 grasps the plug-in strip 15 by a frame 19. The heat sink 18 is provided at opposite sides of its frame 19 with a bent back, plate-shaped portion 22 on which—as shown in more detail with reference to FIG. 3—power components of the device 10 are attached in a heat-conducting manner. The plug-in strip 15 is provided with a groove 23 on the outside at its narrow sides so as to be received at the frame 19 of the heat sink 18, a strip 24 of the heat sink frame 19 engaging in the groove 23. The groove width at the plug-in strip 15 is selected so as to be greater than the strip thickness at the heat sink frame 19 to compensate for manufacturing and assembly tolerances. The heat sink 18 is riveted with the printed circuit board 17 in that rivets 21 are riveted into pocket holes of the heat sink 18 through corresponding bore holes 20 of the printed circuit board. The tolerances between the grooves 2 at the narrow sides of the plug-in strip 15 and the strip 24 of the heat sink frame 19 can be eliminated by deformable or abradable injection-molded projections 44 which are formed onto the plug-in strip 15.

Figure 2:
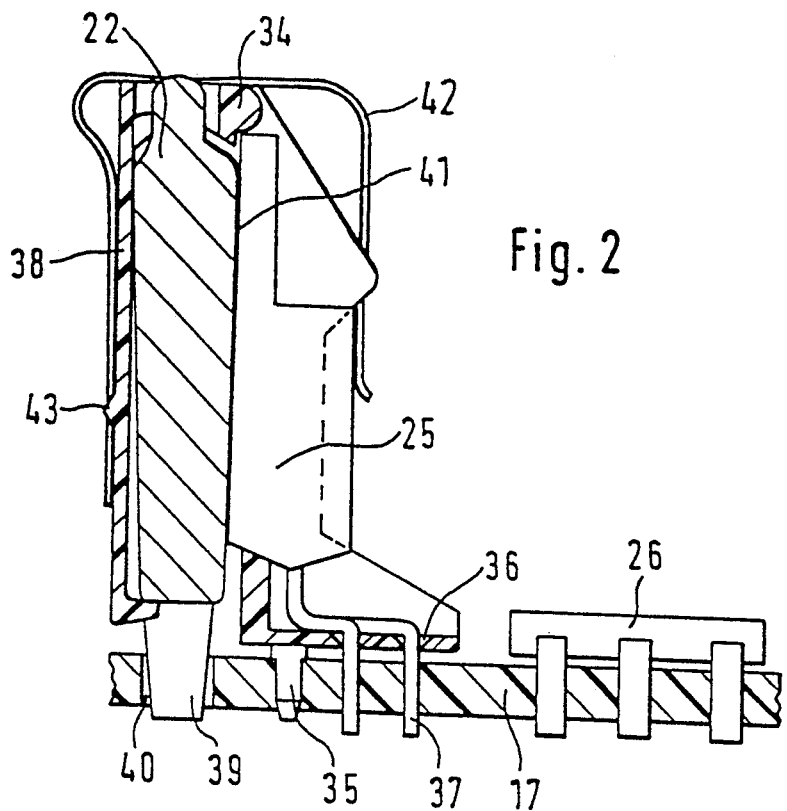
FIG. 2 shows the attachment of a power component to the heat sink.
Figure 3:
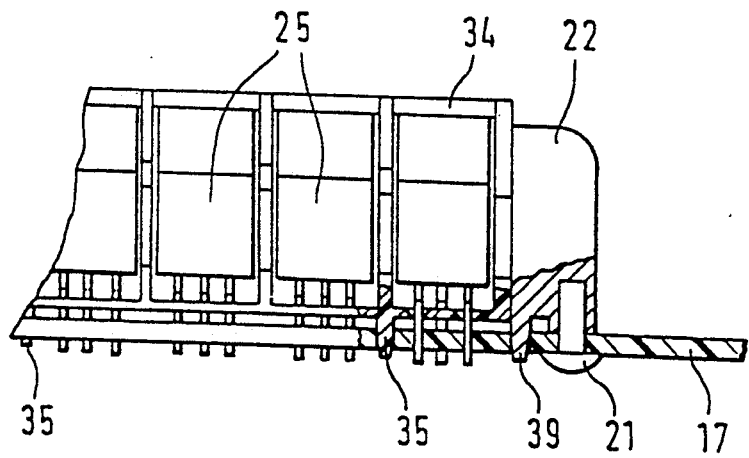
FIG. 3 shows the preassembled construction unit including heat sink, printed circuit board and power components prior to soldering.

The construction unit which is prefabricated in this way can now be outfitted, according to FIGS. 2 and 3, with electronic power components 25 and other electronic components 26 which are then soldered together with conductor paths of the printed circuit board 17 by the plug in tongues 16 and then tested. The cooling frame provides a secure bond between the printed circuit board and plug-in strip so that the solder connections of the pins of the plug-in strip on the printed circuit board are no longer mechanically loaded. A seal 27 which annularly encloses a collar 28 of the plug-in strip 15 and has a sealing eye 29 formed onto the narrow sides is inserted between the plug-in strip 15 and the front panel 13. The heat sink frame 19 has a threaded bore hole 30 on each side of the plug-in strip 15, or a bore hole for a thread-cutting screw, as well as a recess 31 in which a sealing eye 29 of the seal 27 is inserted. Two screws 32 are screwed into the threaded bore holes 30 of the heat sink frame 19 through a hole 33 of the front panel 13 and a sealing eye 29 of the seal 27. The plug-in strip 15 is accordingly covered by the front panel 13 so as to be tight against moisture so that the housing 11 can now be placed on this preassembled construction group and can be screwed together with the front panel 13 so as to be tight against moisture.

FIGS. 2 and 3 shows that the power components 25 are inserted in a plastic frame 34 which is positioned in corresponding holes of the printed circuit board 17 by guide studs 35. When inserting the power components 25, their connection pins 37 can be threaded through conically widened holes 36 of the plastic frame 34 into holes of the printed circuit board 17 located under the latter. A plastic frame 34 which is placed on the plate-shaped portion 22 of the heat sink 18 and locked with it by tongues 38 formed on at the rear are provided for each of the plate-shaped portions 22 of the heat sink 18. Moreover, guide pegs 39 of the plate-shaped portions 22 of the heat sink 18 project into corresponding perforations 40 on the printed circuit board. An electrically insulating, heat conducting foil 41 is glued onto the heat sink 18 between the front side of the plate-shaped portions 22 of the heat sink 18 and the electronic power components 25. Instead of a screw fastening, the power components 25, including their plastic frame 34, can be clamped on at the plate-shaped portion 22 of the heat sink 18 by clamping springs 42. The clamping springs 42 are held at the rear side of the tongue 38 of the plastic frame 34 by a projection 43.

It will be understood that each of the elements described above, or two or more together, may also find a useful application in other types of construction differing from the types described above.

While the invention has been illustrated and described as embodied in an electrical switching and control device, in particular for motor vehicles, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. An electrical switching and control device, particularly for motor vehicles, comprising a housing; a printed circuit board; a plurality of electronic power components arranged in said housing and having leads soldered with said printed circuit board; another component carried by said printed circuit board and connected with the latter; a heat sink carrying said power components and mechanically connected with said printed circuit board, said heat sink receiving heat generated in said power components and guiding it outwards; a plug-in strip arranged at the front side of said housing and soldered at its rear end with said printed circuit board; a frame on said heat sink so that said heat sink grasps said plug-in strip by said frame and is securely connected with said printed circuit board; a front panel placed on said plug-in strip with interposition of a seal and screwed together with said frame of said heat sink, said housing having a front housing opening which is tightly closed by said front panel with a sealing ring.

2. An electrical switching said control device as defined in claim 1, wherein said plug-in strip has a collar, said front panel being placed on said collar of said plug-in strip with interposition of said seal.

3. An electrical switching and control device as defined in claim 1, wherein said heat sink has a plate-shaped portion at opposite sides of said frame grasping said plug-in strip, said plate-shaped portion being bent back and said power components being fastened on said plate-shaped portion in a heat conducting manner.

4. An electrical switching and control device as defined in claim 1, wherein said plug-in strip has narrow sides provided with a groove, said frame of said heat sink having a strip which engages in said groove.

5. An electrical switching and control device as defined in claim 1, wherein said groove has width at said plug-in strip which is greater than a thickness of said strip at said frame of said heat sink, said groove being provided with a projection to compensate for tolerances.

6. An electrical switching and control device as defined in claim 2, wherein said seal inserted between said plug-in strip and said front panel annularly encloses said collar of said plug-in strip and has a sealing eye, said frame of said heat sink having a recess in which said seal is inserted and a threaded bore hole, said front panel having a hole; and further comprising a screw which is screwed into said threaded bore hole of said frame of said heat sink through said hole of said front panel and into said sealing eye of said seal.

7. An electrical switching and control device as defined in claim 1, wherein the printed circuit board has holes; and further comprising a plastic frame having guide projections positioned in said holes of said printed circuit board and also having conically widened holes, said power components having connection pins which are threaded into said holes of said printed circuit board through said conically widened holes of said plastic frame.

8. An electrical switching and control device as defined in claim 7, wherein said heat sink has a plate-shaped portion, said plastic frame of said power components being lockable with said plate-shaped portion of said heat sink.

9. An electrical switching and control device as defined in claim 8; and further comprising clamping springs, said power components being fastened by said plastic frame at said plate-shaped portion of said heat sink by said clamping springs.

10. An electrical switching and control device as defined in claim 3, wherein said printed circuit board has perforations, said plate-shaped portion of said heat sink having guide pegs inserted into said perforations of said printed circuit board.

* * * * *